(12) United States Patent
Alelyunas et al.

(10) Patent No.: US 6,507,303 B1
(45) Date of Patent: Jan. 14, 2003

(54) DIRECT DIGITAL CONVERSION OF BASEBAND SIGNALS TO SUPER-NYQUIST FREQUENCIES

(76) Inventors: Carl H. Alelyunas, 11674 Forest View Dr., Nevada City, CA (US) 95959; Cotter W. Sayre, 19878 New Rome Rd., Nevada City, CA (US) 95959; Larry Thomson, 98 Salem Hill Rd., Howell, NJ (US) 07731

(*) Notice: Subject to any disclaimer, the term of this patent is extended or adjusted under 35 U.S.C. 154(b) by 0 days.

(21) Appl. No.: 09/584,459

(22) Filed: May 31, 2000

(51) Int. Cl.$^7$ ................................................. H03M 1/66
(52) U.S. Cl. ........................................ 341/144; 341/118
(58) Field of Search .............................. 341/144, 143, 341/118

(56) References Cited

U.S. PATENT DOCUMENTS

| | | | |
|---|---|---|---|
| 3,987,280 A | 10/1976 | Bauer | 341/144 |
| 4,680,556 A | 7/1987 | Nakamura et al. | 332/16 R |
| 5,061,925 A | 10/1991 | Sooch et al. | 341/120 |
| 5,225,795 A | 7/1993 | Iinuma | 332/100 |
| 5,424,044 A | 6/1995 | Kalka | 422/171 |
| 5,583,501 A | 12/1996 | Henrion et al. | 341/118 |
| 5,621,675 A | 4/1997 | Linz et al. | 364/724.1 |
| 5,696,796 A | 12/1997 | Poklemba | 375/316 |
| 6,215,430 B1 | 4/2001 | Smith et al. | 341/144 |

OTHER PUBLICATIONS

J.L. Brown, Jr., "First–Order Sampling of Bandpass Signals—A New Approach," IEEE Transactions on Information Theory, vol. IT–26, No. 5, Sep. 1980, pp. 613–615.

R. Groshong and S. Ruscak, "Undersampling Techniques Simplify Digital Radio," Electronic Design, May 23, 1991, pp. 67–78.

R. Groshong and S. Ruscak, "Exploit Digital Advantages in as SSB Receiver," Electronic Design, Jun. 13, 1991, pp. 89–96.

C. Giarrizzo, et al., *Communication Systems: Towards Global Integration*, "A Technique for SAR Image Restoration," pp. 371–375.

L. Jackson, *Digital Filters and Signal Processing*, $3^{rd}$ Ed., Kluwer Academic Publishers, 1996, pp. 169–170.

Linear Circuits, Data Acquisition and Conversion, Data Book vol. 2, Texas Instruments, pp. 2–9 to 2–31.

F. Marvasti, "A New Method to Compensate for the Sample-–and Hold Distortion," IEEE Transactions on Acoustics, Speech, and Signal Processing, vol. ASSP–33, No. 3, Jun. 1985, pp. 738–741.

*Primary Examiner*—Howard L. Williams
(74) *Attorney, Agent, or Firm*—McDonnell Boehnen Hulbert & Berghoff

(57) ABSTRACT

Method and apparatus for shifting of a lowpass signal to a higher frequency and for precompensating distortion caused by a digital to analog converter (DAC). Higher frequency signals are generated by filtering the output of the DAC so that at least one of the replicas generated by the DAC is the signal of interest. In this manner, the higher frequency signals for wireless transmitters, or for other applications, may be generated more easily. Moreover, compensation for distortion caused by the DAC is performed by a precompensator which modifies for distortion, not at the baseband signal, but at a passband frequency.

30 Claims, 10 Drawing Sheets

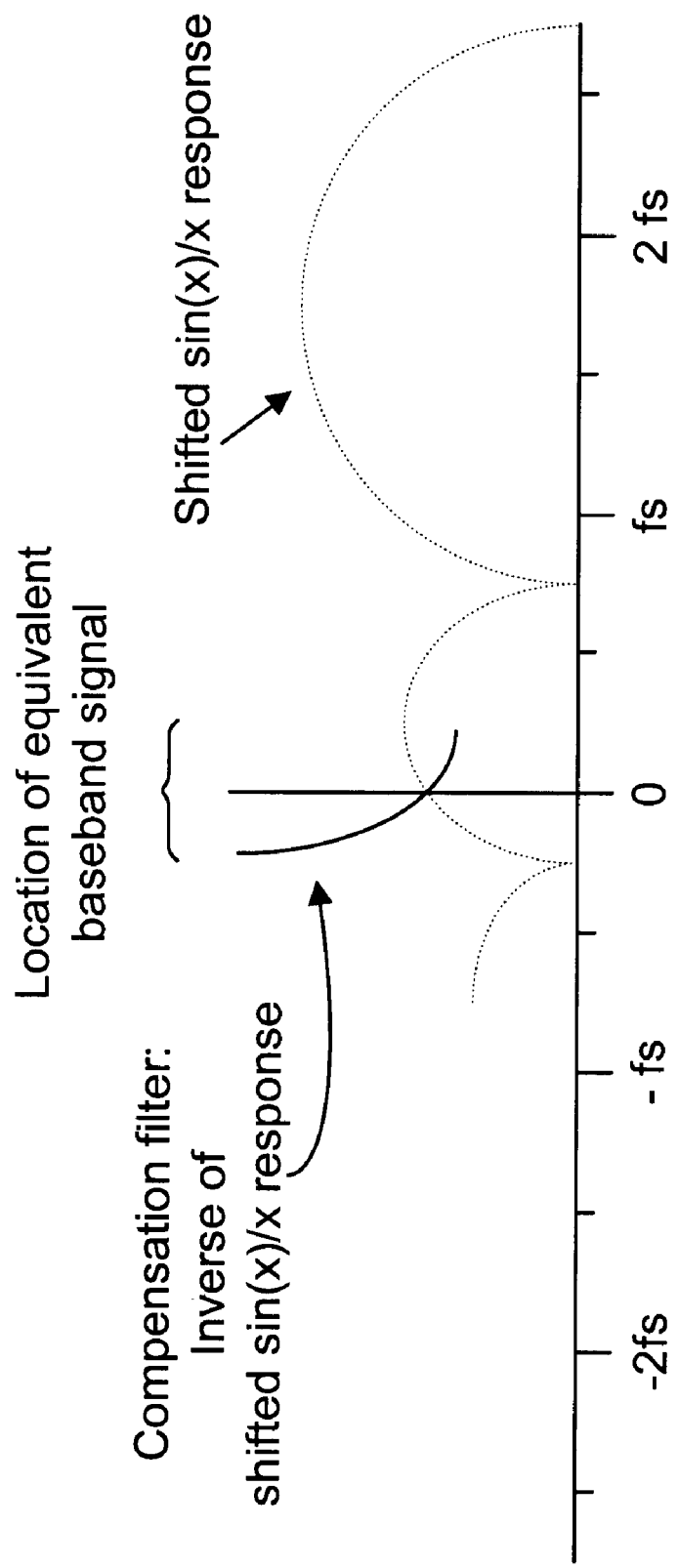

DIRECT DIGITAL CONVERSION OF BASEBAND SIGNALS TO SUPER-NYQUIST FREQUENCIES

REFERENCE TO RELATED APPLICATIONS

This application is related to U.S. patent application Ser. No. 09/584,431 filed on May 31, 2000 and entitled Precompensation for Distortion due to Digital to Analog Conversion.

BACKGROUND OF THE INVENTION

Lower frequency signals (such as baseband signals) are often converted to higher frequencies for various applications. One example of a conversion is in the area of wireless transmitters. Typically, a baseband signal is converted to an intermediate frequency (IF) before being converted to the final output radio frequency (RF). In the wireless context, this conversion to an intermediate frequency is often necessary because (1) the required filtering may be impossible at the final output radio frequency; and/or (2) the use of an IF allows for easier and more inexpensive filtering and amplification.

Other examples of wherein a signal is translated to a higher frequency include ADSL and cable modems which modulate signals to higher frequencies.

With recent advances in digital processing speed, it is possible to create a digital baseband signal and digitally modulate such a signal, thereby creating a digital passband signal. This digital passband signal, sometimes called a digital IF, if it is not at the final output frequency, is then sent to a high speed digital to analog converter (DAC) whose output can be subsequently filtered, amplified, and further upconverted as desired. Prior art digital implementations perform this modulation by either multiplying by a sinusoid or by use of a look-up table containing results of such multiplications.

The constraint for sampling rates in digital systems, that are generally applicable, is that the sampling rate should be greater than twice the highest frequency component in the desired signal. The minimum sampling frequency is often called the "Nyquist rate." Prior art implementations of transmitters have required the sampling rate to be more than twice the highest frequency component of the modulated signal.

In addition, when a digital signal is converted into an analog signal, distortion may occur. One example of distortion is a multiplication of the signal by $\sin(x)/x$. Prior art implementations have attempted to compensate for this distortion by modifying the baseband signal prior to introduction to the Digital to Analog Converter (DAC). However, particularly in instances where the baseband signal is being shifted, this implementation may be inadequate since the higher frequencies of interest are not the focus of the compensation.

SUMMARY OF THE INVENTION

This invention provides a method of translating a baseband signal to frequency higher than twice the sampling rate by delivering a lowpass signal to a DAC and then filtering out all output images except for the image at the desired frequency.

This invention further provides a novel use of a shifted $\sin(x)/x$ response to compensate for distortion from the DAC at the frequency of interest.

Therefore, an object of the invention is to provide a method and apparatus configured to translate a baseband or lowpass signal to a frequency higher than twice the sampling rate.

It is a further object of the invention to provide a method and apparatus configured to process at least one image which is output of the digital to analog converter.

It is also an object of the invention to provide a method and apparatus configured to compensate for the distortion from the digital to analog converter.

It is still a further object of the invention to provide a method and apparatus configured to shift the $\sin(x)/x$ response to compensate for distortion from the DAC at the frequency of interest.

The advantages of the present invention will become apparent to those of ordinary skill in the art by reading the following detailed description, with appropriate reference to the accompanying drawings.

BRIEF DESCRIPTION OF THE DRAWINGS

FIG. 4b is a waveform of the compensation filter for the baseband signal and the shifted $\sin(x)/x$ response.

DETAILED DESCRIPTION OF THE PRESENTLY PREFERRED EMBODIMENTS

Shifting of a baseband signal to a higher frequency is often an important task in the transmission of a signal. Prior art implementations directed to frequency shifting have required the sampling rate to be more than twice the highest frequency component of the modulated signal. The present invention, in contrast, generates a higher frequency signal, and in a preferred embodiment an intermediate frequency (IF) signal, centered at a frequency above half the Nyquist rate. In this manner, the higher frequency signals for wireless transmitters, or for other applications, may be generated more easily.

Compensation for distortion caused by the Digital to Analog Converter (DAC) is likewise an important task. This compensation is typically performed to adjust for distortion in the baseband frequency. In contrast, in the present invention, the compensation adjusts for distortion at the frequency of interest. In a preferred embodiment, the frequency of interest is the IF passband frequency.

Figure 1:
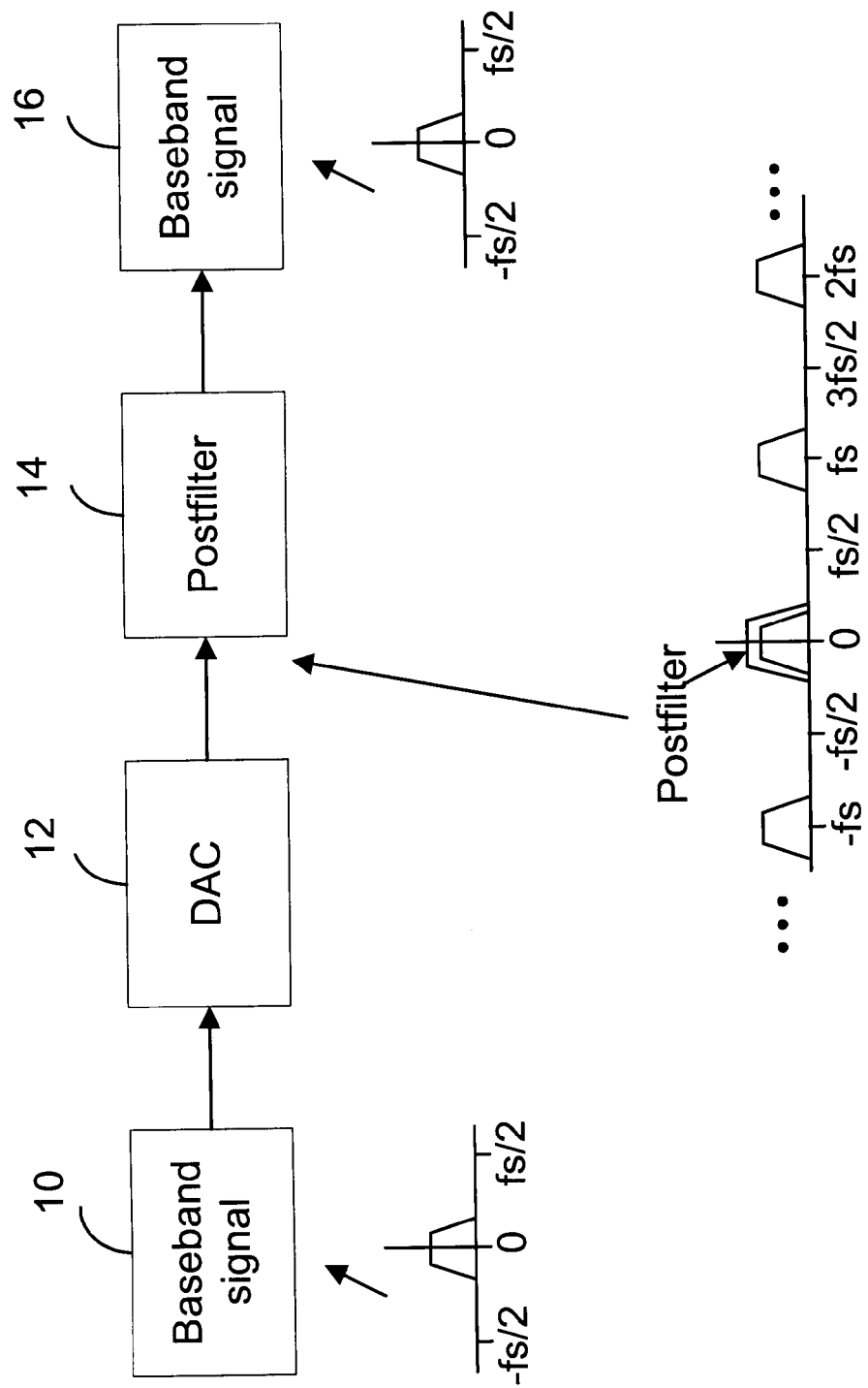
FIG. 1 is a block diagram of a prior art implementation of postfiltering.

The presently preferred embodiments of the invention will now be described by reference to the accompanying figures, wherein like elements are referred to by like numerals. FIG. 1 is a block diagram of a prior art implementation of postfiltering. As shown at block 10, the digital baseband signal is present. In one example, the baseband signal has frequencies which are in between $-f_s/4$ and $f_s/4$ (where $f_s$ is the sampling frequency). The digital baseband signal is converted into an analog signal via a Digital to Analog Converter (DAC), as shown at block 12. In a system in which the sampling frequency is $f_s$, a digitally sampled signal has the characteristic that the frequency components between $-f_s/4$ and $f_s/4$ are replicated throughout the spectrum from minus infinity to infinity at intervals of the sampling frequency, as can be seen from the equation for the discrete time Fourier transform of a signal:

$$x(e^{jwt}) = 2\pi \sum_{k=-\infty}^{\infty} \delta(\omega - \omega_o - 2\pi k)$$

where $\omega=2\pi f$. The $2\pi k$ term gives rise to the periodic repetition of the baseband signal at intervals of $f_s$.

In prior art applications, these replicas, or images, were considered undesirable. Hence, a typical system would have a postfilter after the DAC in order to remove the unwanted replicas, as shown at block 14 of FIG. 1. This postfilter is usually an approximation to a "brick wall" filter which cuts off all frequencies above half the sampling frequency, $f>|f_s/2|$. This eliminates (or severely attenuates) all of the images, keeping only the baseband signal, as shown at block 16 of FIG. 1. This baseband signal can then be modulated in hardware up to the desired frequency. The additional hardware necessary to modulate the baseband signal up to the desired frequency may include (1) heterodyning to increase the frequency (e.g., an oscillator fed into mixer); or (2) non-linear frequency multiplication (if there are no envelope variations in the signal) (e.g., diodes or overdriven amplifiers).

Figure 2:
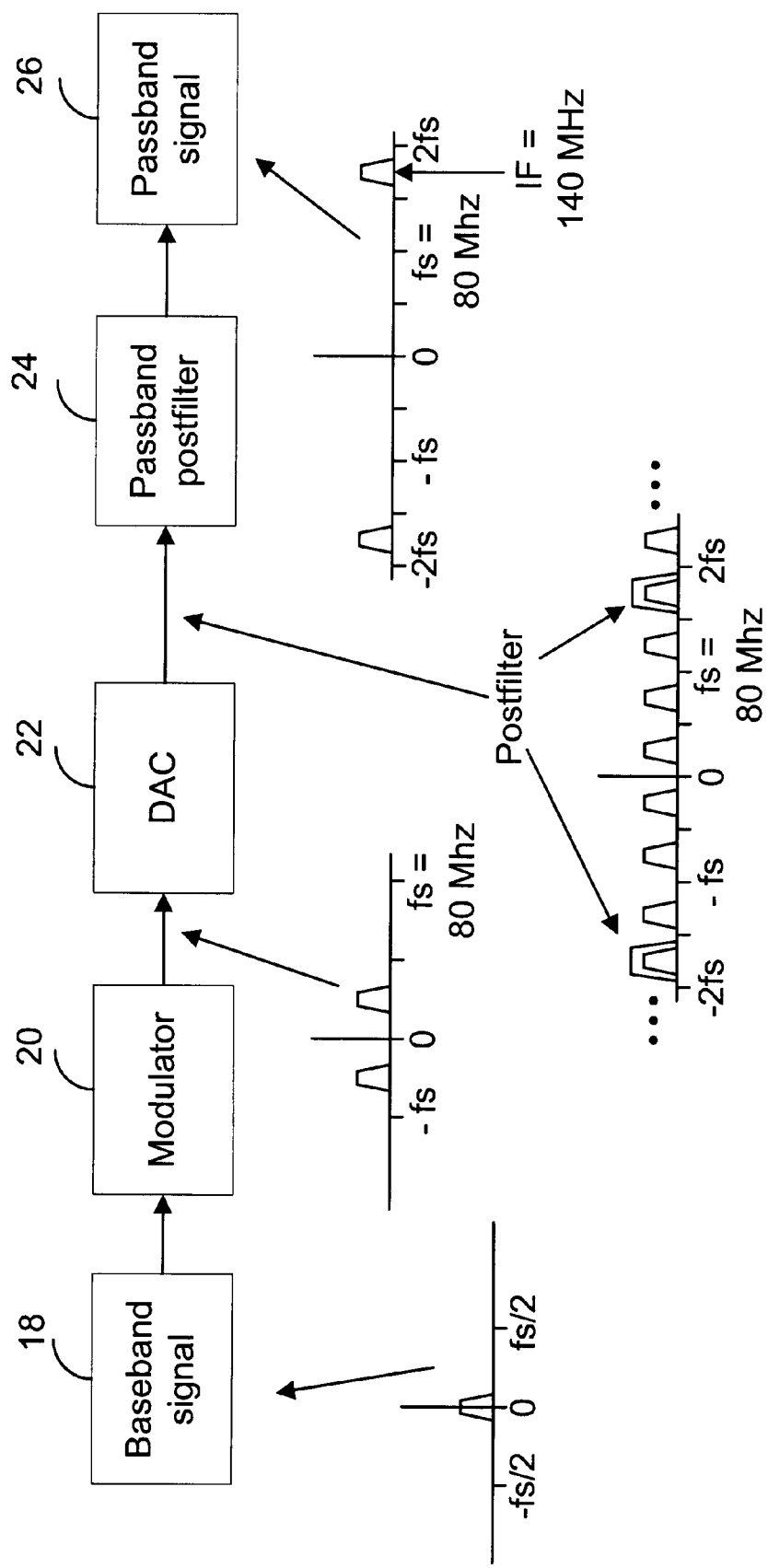
FIG. 2 is a block diagram of a direct conversion of a baseband signal to a passband signal (with the $\sin(x)/x$ distortion neglected).

In a preferred embodiment of the present invention, the baseband signal may be modulated up to a higher frequency without the use of a hardware modulator. Referring to FIG. 2, there is shown a block diagram of a direct conversion of a baseband signal to a passband signal. The distortion associated with the DAC is not considered in this figure, but is discussed subsequently. As shown at block 18 of FIG. 2, a baseband signal is provided similar to the signal in FIG. 1. An example of the baseband signal is shown in FIG. 2.

In one example, the baseband signal is situated between $-f_s/4$ and $f_s/4$. Prior to sending the signal to the DAC, the signal is modulated using a modulator, as shown at block 20. In one embodiment, the modulator is performed in software by multiplying the baseband signal with a complex sinusoid having a frequency of $f_s/4$. The multiplication results in a shifting of the baseband signal to between 0 and $f_s/2$. The multiplication also results in a mirror image of the baseband signal (identical in content) from $-f_s/2$ to 0, as shown in FIG. 2.

Alternatively, in order to shift the baseband and create a mirror image, the fourier transform of the baseband signal may be taken. Thereafter, the transform may be shifted in frequency and the inverse fourier transform is taken to return to the time domain.

As discussed previously, one method for modulating the signal is by multiplying by a complex sinusoid. The baseband signal is multiplied by $e^{i*2\pi N(fc/fs)}$ where N=sample number; $f_c$=carrier frequency (cycles/sec); and $f_s$=sampling frequency. By choosing the proper carrier frequency and sampling frequency, the modulating (by multiplying by the complex sinusoid) is simplified considerably. For example, if one wishes to have an image centered at 70 MHz, and $f_c$=10 MHz and $f_s$=40 MHz, the baseband signal should be modulated so that the baseband signal is centered at 10 MHz and −10 MHz. The complex sinusoid to perform this modulation is $e^{i*(\pi/2)*N}$. Since N is an integer, the value of the complex sinusoid is ±1 or ±i. Therefore, multiplication of the baseband signal is greatly simplified by merely changing the sign.

The digital low-pass signal is converted to an analog signal by a DAC, as shown at block 22. The output of the DAC is also shown in FIG. 2 with the baseband signal and images. As discussed previously, the DAC generates images which ordinarily are discarded. However, in the present invention, these images are the signals of interest and the analog baseband signal is not the signal of interest. Specifically, the images at a higher frequency (in one embodiment, the positive and negative passbands) are the focus of the signal processing. So that, the positive and negative passbands have the images of the signal (with one of the passbands having the same signal as the original baseband signal and the other passband having the mirror image of the original baseband signal). Without the use of the modulator prior to conversion with the DAC, the images located in the negative and positive passbands would be the same (i.e., the same as the original baseband signal).

In addition, the choice of the sampling frequency dictates where the images are. In particular, the baseband signal can be digitally modulated to some frequency below $f_s/2$ such that one of the images falls at the desired IF.

Referring to FIG. 2, there is shown a postfilter which receives the output of the DAC. The postfilter in a preferred embodiment is a passband postfilter. In the present invention, the postfilter is centered at the desired IF, rather than being centered at zero as was done in the prior art. Thus, low pass signals, including the baseband signal, and other images are attenuated. And, the intermediate frequency passband signal is maintained. Thus, the conventional "desired" signal (the baseband signal) is rejected and the conventional "undesirable" signal (at least one, some or all of the images or replicas) are kept for processing. In a preferred embodiment, the images at the negative and positive passbands are reserved for processing.

In a preferred embodiment, the postfilter is a surface-acoustic-wave (saw) filter. The saw filter is chosen based on two criteria: the center frequency of the filter and bandwidth of the filter around the center frequency. One manufacturer for saw filters is Sawtek, Inc. in Orlando, Fla. When using a saw filter, there may be a 15 db loss in the signal of interest; if this is the case, an amplifier may be necessary to boost the signal leaving the saw filter. In an alternate embodiment, the postfilter is in the form of an L-C filter.

For example, suppose that the sampling rate is 80 MHz and the desired IF is 140 MHz, as shown in FIG. 2. The output of the DAC will have images centered at {. . . −140, −100, −60, −20, 20, 60, 100, 140, . . .} MHz, with the images at multiples of −20 MHz being inverses of those at multiples of +20 MHz. A passband filter of bandwidth 35 MHz centered at 140 MHz placed at the output of the DAC would have an output containing only the 140 MHz IF signal, as shown in FIG. 2.

It should be noted that while the present embodiment is described in the context of a transmission system with one or more intermediate frequencies, the invention is fully applicable to systems which have no intermediate frequency. This invention would have application in any system wherein a baseband signal or a low pass signal needs to be translated to a higher frequency.

Figure 3:
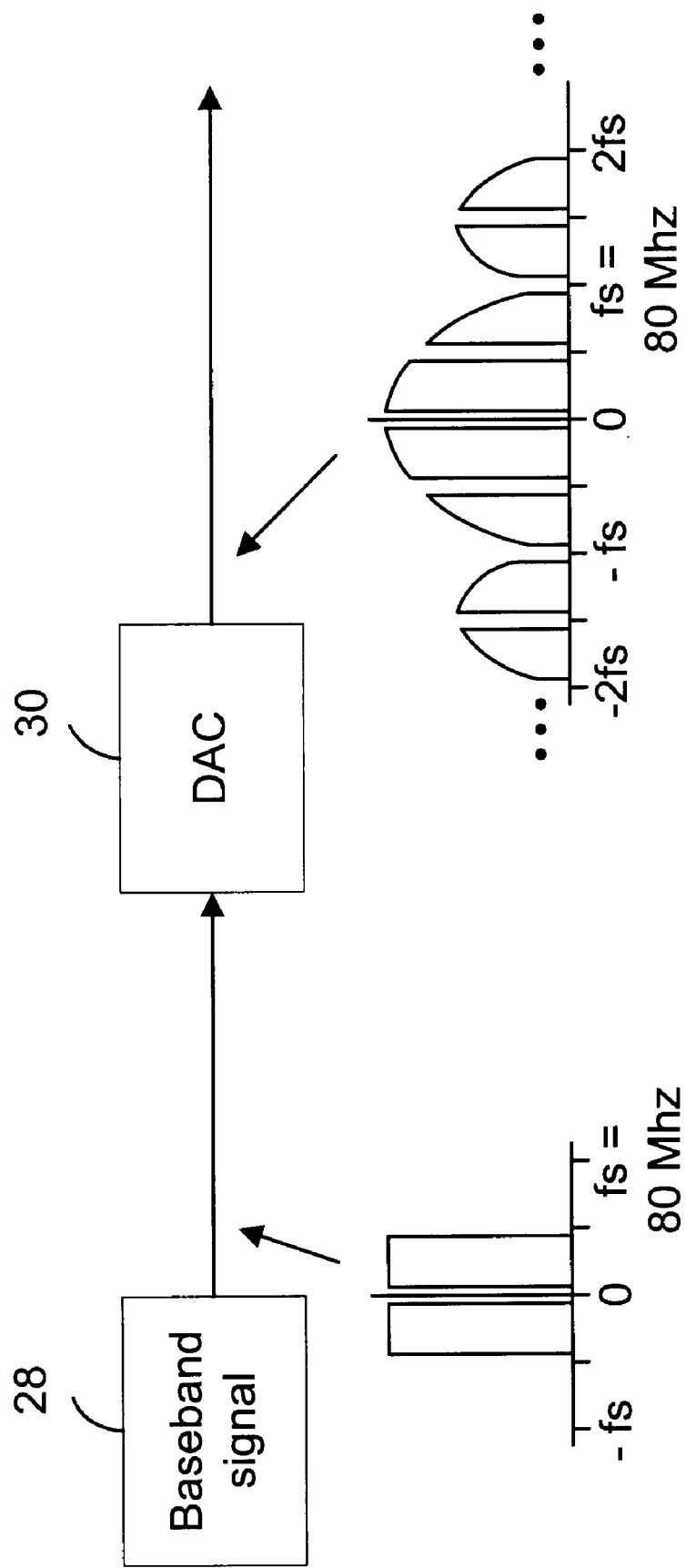
FIG. 3 is a block diagram of a response of a digital to analog converter (DAC) without compensation for distortion.
Figure 4A:
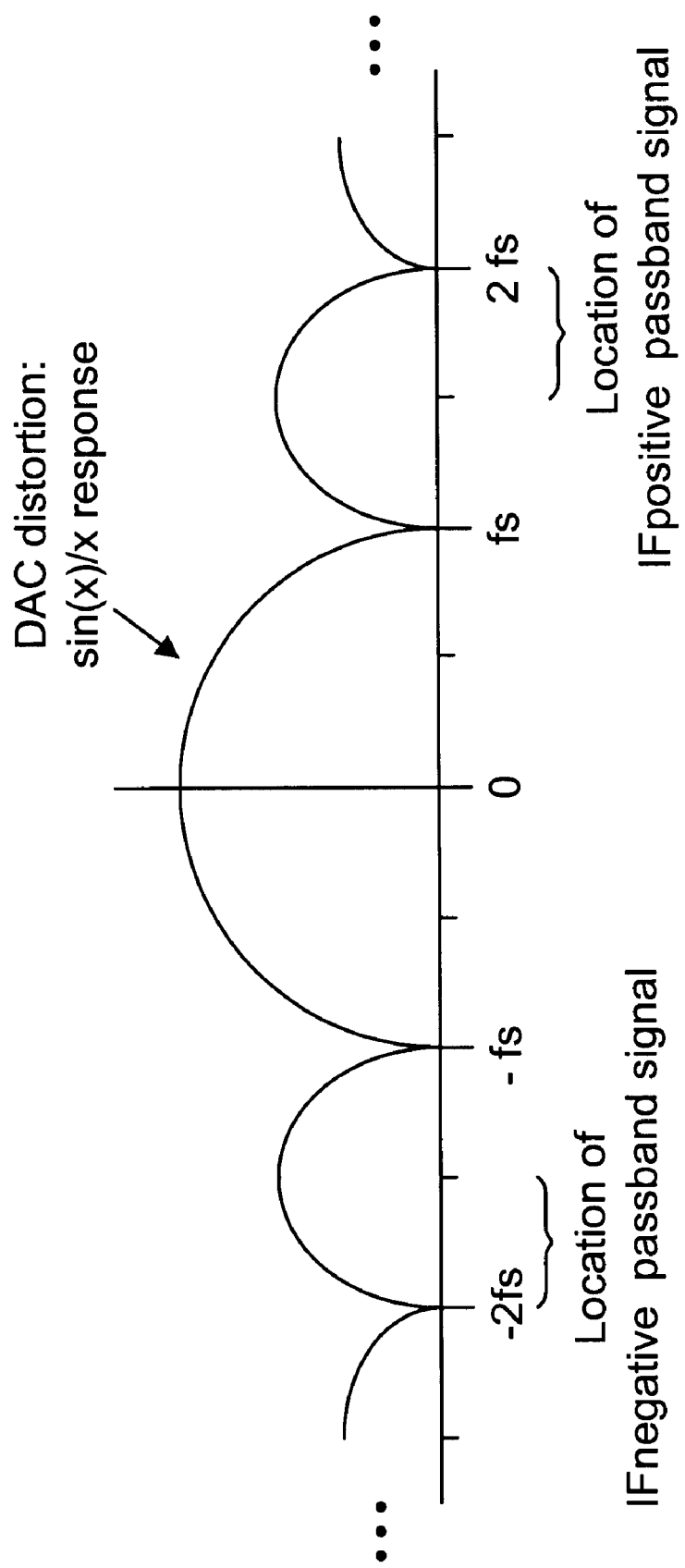
FIG. 4a is a waveform of the DAC distortion ($\sin(x)/x$ response).

Unfortunately, as is well known in the art, a DAC causes distortion in the converted signal. One example of distortion is in a zero-order hold DAC which has a $\sin(x)/x$ frequency response, as shown in FIG. 3. An example of a baseband signal (block 28) and the resulting distortion of the DAC 30 (including distortion to the images) is shown in FIG. 3. FIG. 4a shows a waveform of the DAC distortion ($\sin(x)/x$ response). FIG. 4a further shows the location of the IF passband signal, which is the section of the waveform of interest, and the associated distortion with the images in the frequency band of interest.

In the prior art, the distortion introduced in a baseband signal when passed through a DAC is approximately compensated for with either a simple digital or analog filter that boosts the higher frequencies. While this solves the potential distortion in the baseband signal, this solution will not correctly compensate for the distortion of higher frequency images.

To correctly compensate for the distortion, the compensation focuses on the effect of the distortion on the image (or images) of interest. In a preferred embodiment, the image of interest is at the intermediate frequency (IF). Therefore, the correct compensation solution for the image at IF is the inverse of the distortion (with the $\sin(x)/x$ distortion, the correct compensation solution is the inverse of the $\sin(x)/x$ response at the IF frequency). In this manner, the filtering of the signal prior to conversion by the DAC (and the attendant distortion to the signal that results) allows for a more flat signal in the frequency spectrum of interest (i.e., a higher frequency spectrum than baseband). Moreover, the distortion due to the DAC is "precompensated" (i.e., the distortion is anticipated so that the baseband signal is modified prior to conversion by the DAC). Therefore, the distortion associated with the image of interest is minimized due to the precompensation.

Figure 5:
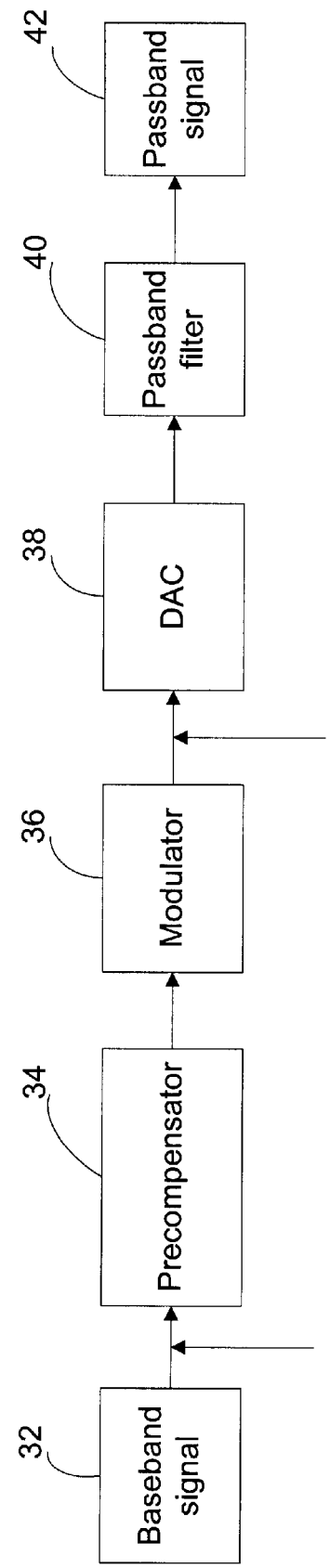
FIG. 5 is a block diagram of a direct conversion of a baseband signal to a passband signal (with the $\sin(x)/x$ distortion precompensated).
Figure 6A:
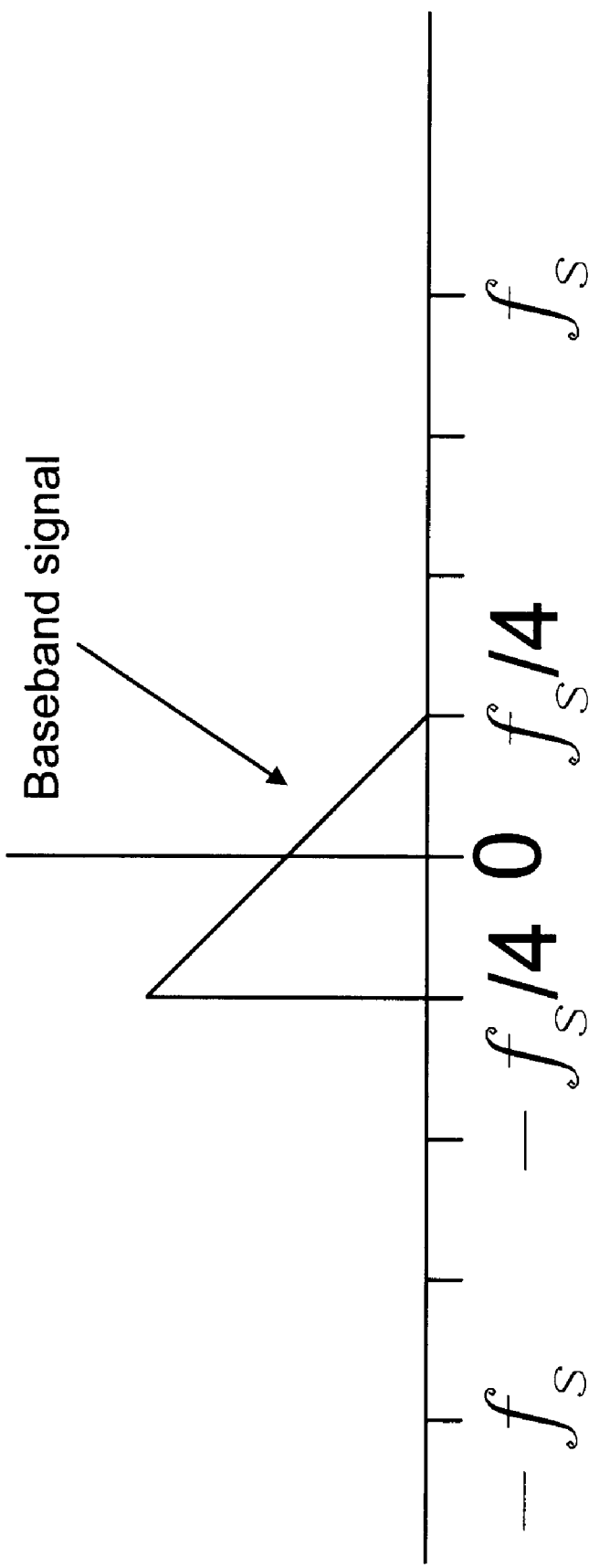
FIG. 6a is an example of a baseband signal.

Referring to FIGS. 4b, there is shown one example of the precompensation of the distortion for the intermediate frequency of interest. The precompensation is in the form of a waveform for multiplication with the baseband signal and, in a preferred embodiment, is a shifted $\sin(x)/x$ response. An example of a baseband signal is shown in FIG. 6a. The baseband signal is sent to the precompensator 34, as shown in FIG. 5. The precompensated baseband signal is then sent to a modulator 36. Alternatively, the precompensator may be placed after the modulator so that the baseband signal is first modulated and then precompensated. Thereafter, the signal is sent to a DAC 38, converting the precompensated and modulated digital signal into an analog signal with images. The image (or images) of interest are filtered based on the passband filter 40 thereby generating a passband signal 42.

Figure 6B:
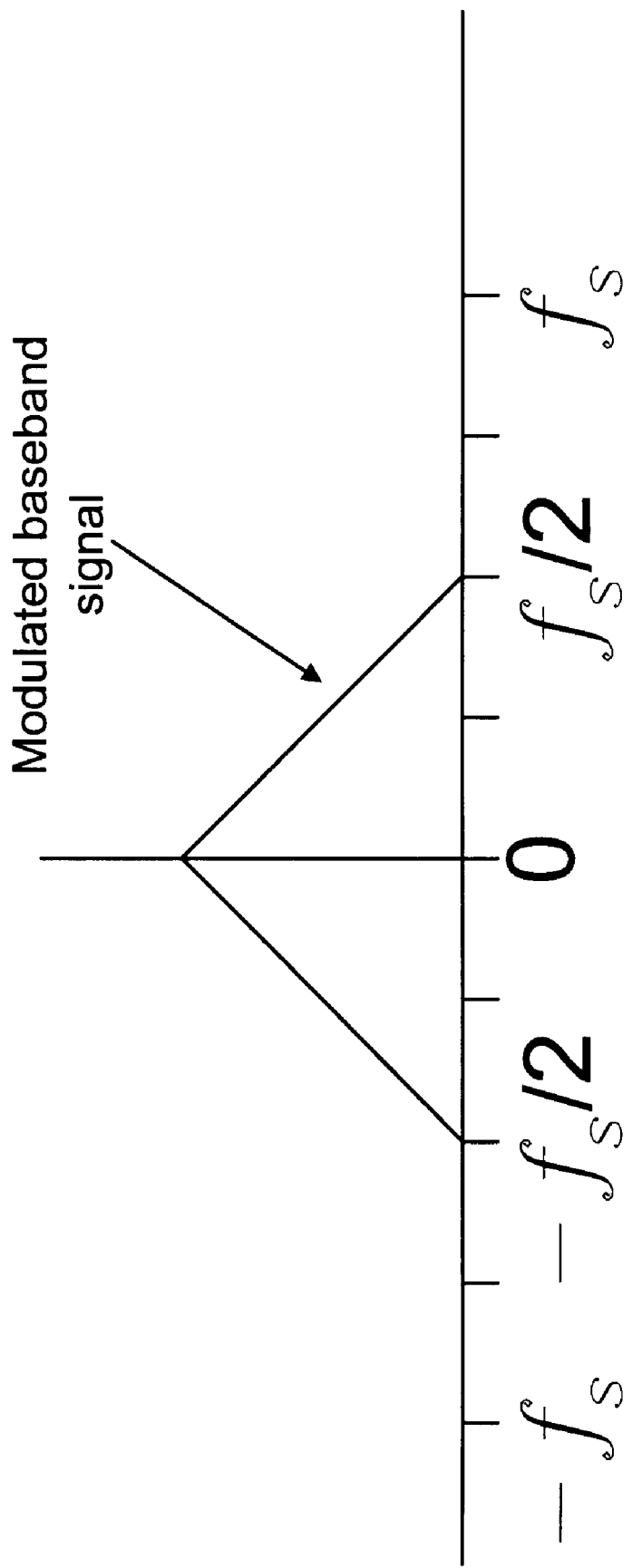
FIG. 6b is an example of a baseband signal, as shown in FIG. 6a, which is modulated but not precompensated for distortion.
Figure 6C:
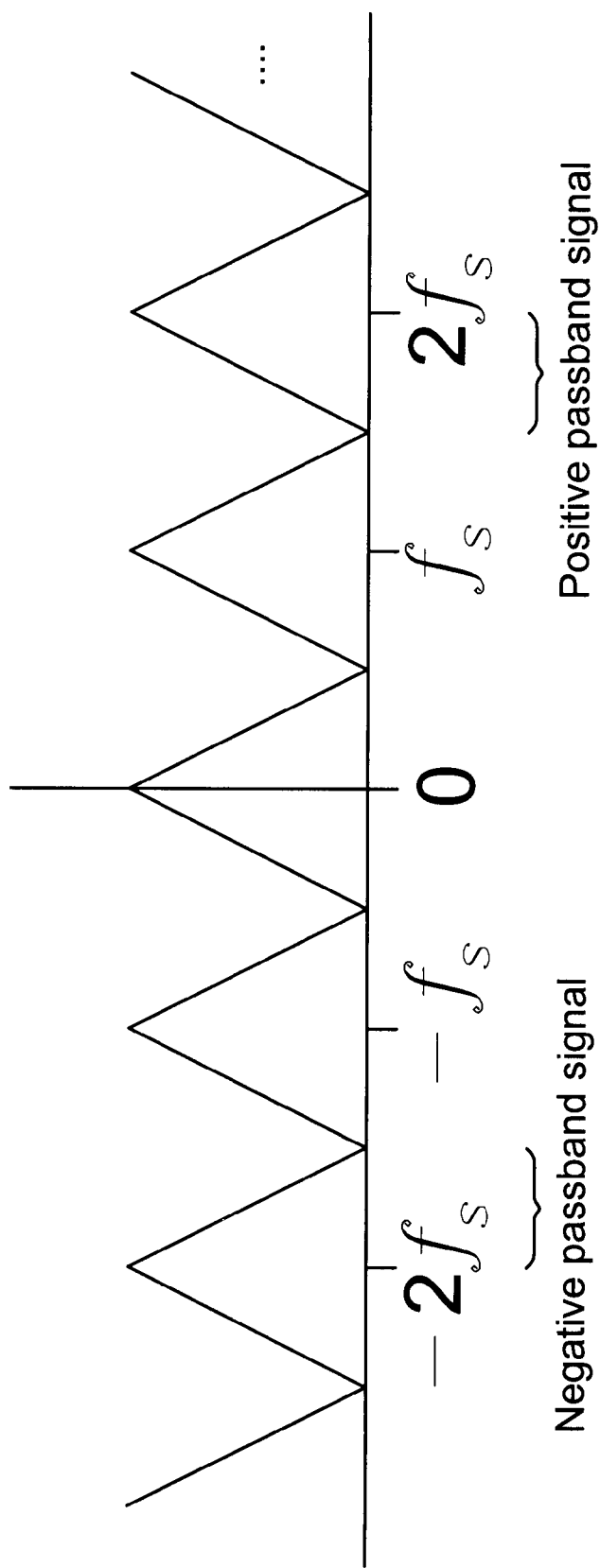
FIG. 6c is a frequency response for a modified baseband signal, as shown in FIG. 6b, after the signal is processed through the DAC.
Figure 6D:
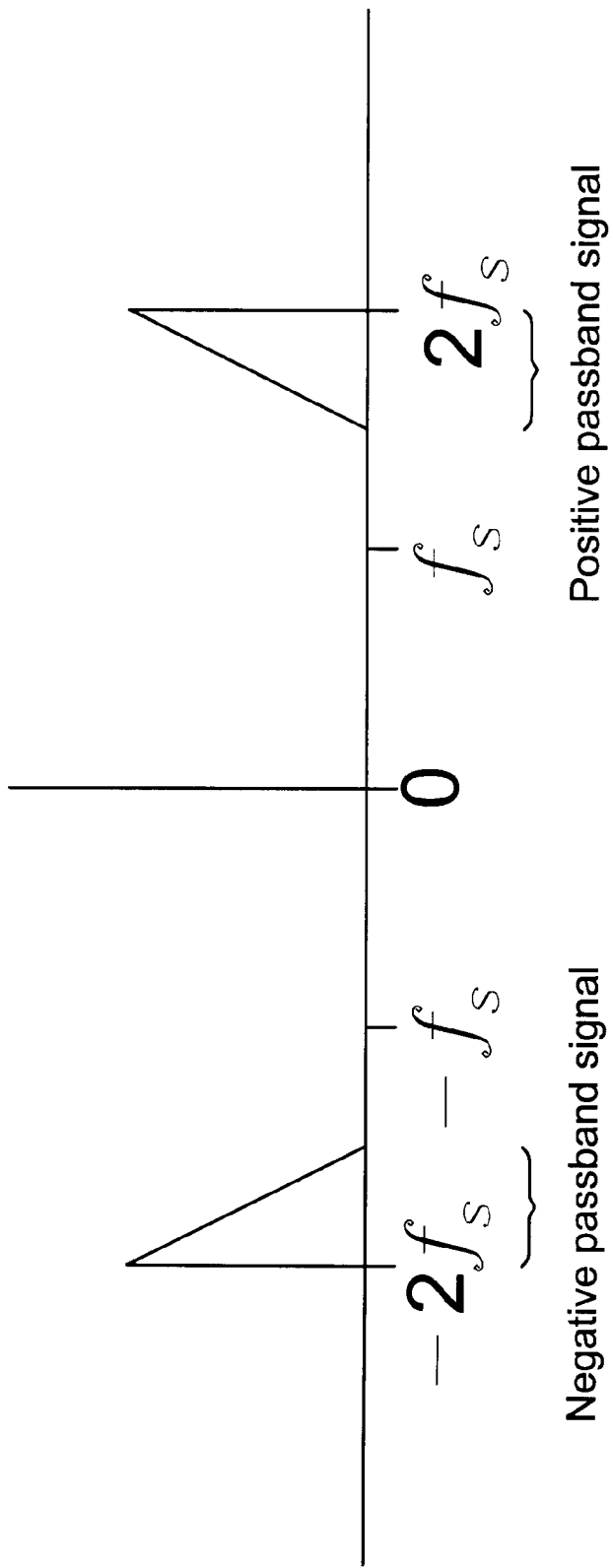
FIG. 6d are the negative and positive passband signals at the intermediate frequency for FIG. 6c.

In order to determine the waveform for the precompensator, the effect of the distortion at the frequency band of interest must be determined. As discussed previously, the digital baseband signal is modulated by the modulator 36 (i.e., shifted and a mirror image generated) prior to conversion from digital to analog. FIG. 6b shows an example of the modulated baseband signal. After sending the modulated baseband signal to the DAC 38, the result (without accounting for distortion) is shown in FIG. 6c. In this case, the frequency band of interest is between $3/2f_s$ and $2f_s$, and between $-2f_s$ and $-3/2f_s$, as shown in FIG. 6c. Comparing the signals at the frequency bands of interest (the positive and negative passbands), it is shown that the negative passband signal is the same as the original baseband signal (as shown in FIG. 6a) whereas the positive passband signal is a mirror image of the baseband signal. Thus, the negative passband signal is chosen as the passband of interest for purposes of compensating for the distortion. The distortion at the negative passband signal (the $\sin(x)/x$ distortion) is shifted so that the distortion is centered at zero (baseband). And, the inverse of the shifted curve in the baseband frequency band is determined. From that, an impulse response is generated (for example by using an Inverse Fourier Transform), which gives an impulse response. That impulse response is then convolved with the baseband signal in order to precompensate for the distortion. In the example of FIG. 6d, the passband of interest is between $-2f_s$ and $-3/2f_s$, with a center for the passband being $-7/4f_s$. In order to determine the precompensator multiplier, the center of the passband of interest should be shifted to baseband (i.e., shifted to the right) and inverted. Thus, in this example, the $\sin(x)/x$ distortion should be shifted $7/4f_s$ and inverted.

Moreover, in the example previously discussed wherein the Intermediate Frequency (IF) is 140 MHz, the response of the inverse of $\sin(x)/x$ (i.e. $x/\sin(x)$) at 140 MHz is shifted so as to be centered at 0 Hz. Also, since the image at 140 MHz is inverted in frequency (as are all even numbered images), the compensation response must also be inverted in frequency. For odd numbered images, e.g. 100 MHz, this frequency inversion is not necessary. An equivalent way to understand this is to use the negative IF without inversion for even images.

Suppose, as in the example above, the fourth image is the desired IF. The equation of a baseband compensation filter for this case is:

$$H(f) = \frac{\pi\left(\frac{f}{fs} - \frac{7}{4}\right)}{\sin\left[\pi\left(\frac{f}{fs} - \frac{7}{4}\right)\right]}, -\frac{fs}{4}\langle f \langle \frac{fs}{4}$$

The impulse response of this shifted inverted frequency response curve [H(f)] is then convolved with the baseband signal (which is centered at 0 Hz) to precompensate the baseband signal prior to being digitally modulated or sent to the DAC.

Assuming that the baseband signal was flat to begin with, filtering the signal in this matter will result in an intermediate frequency that has a flat frequency response.

In the example above, the negative passband was the passband of interest (i.e., the passband where the image is the same as the original baseband signal). However, the positive passband may be the passband of interest in other instances. For example, if the intermediate passband were in between $f_s$ and $3/2f_s$ instead of $3/2f_s$ and $2f_s$ as discussed above, the positive passband would be the passband of interest. Accordingly, the $\sin(x)/x$ distortion would be shifted to the left by $5/4f_s$ and inverted. And, depending on whether the passband of interest is the negative passband or the positive passband, the $\sin(x)/x$ distortion would be shifted either right or left.

Alternatively, the $\sin(x)/x$ distortion may in all instances be shifted either right or left, and possibly take the mirror image of the distortion depending on the center of the passband. For instance, the $\sin(x)/x$ distortion may always be shifted to the right so that the distortion of the passband is centered at 0. If the passband is centered at $3/4f_s$, $7/4f_s$, $11/4f_s$, ..., then the negative passband is the passband of interest (the same as the baseband signal) so that no adjustment is necessary. In the example above, the passband was centered at $7/4f_s$. If the passband is centered at $1/4f_s$, $5/4f_s$, $9/4f_s$, ..., then the positive passband is the passband of interest (the same as the baseband signal), and the mirror image about 0 of the $\sin(x)/x$ distortion should be taken.

It is to be understood that additional alternative forms of the various components of the described embodiments are covered by the full scope of equivalents of the claimed invention. Those skilled in the art will recognize that the preferred embodiment described in the specification may be altered and modified without departing from the true spirit and scope of the invention as defined in the following claims, which particularly point out and distinctly claim the subjects regarded as the invention.

We claim:

1. Method of converting a digital lowpass signal to an analog signal in a frequency spectrum higher than the lowpass signal, the method comprising the steps of:

determining distortion due to converting the digital lowpass signal to analog signal in the frequency spectrum higher than the lowpass signal;

modifying the digital lowpass signal based on the distortion in the frequency spectrum higher than the lowpass signal;

converting the digital lowpass signal using a sampling frequency ($f_s$) to the analog signal, the analog signal having an analog lowpass signal and replicas, the replicas being at intervals of the sampling frequency;

selecting at least one of the replicas in the frequency spectrum higher than the lowpass signal; and rejecting the analog lowpass signal.

2. The method of claim 1 wherein the step of converting the digital lowpass signal using a sampling frequency to the analog signal includes using a digital to analog converter.

3. The method of claim 1 wherein the steps of selecting at least one of the replicas and rejecting the analog lowpass signal include using a filter which has a passband in the frequency spectrum higher than baseband.

4. Method of converting a digital lowpass signal to an analog signal in a frequency spectrum higher than the lowpass signal, the method comprising the steps of:

modulating the digital baseband signal;

converting the digital lowpass signal using a sampling frequency ($f_s$) to the analog signal, the analog signal having an analog lowpass signal and replicas, the replicas being at intervals of the sampling frequency;

selecting at least one of the replicas in the frequency spectrum higher than the lowpass signal; and rejecting the analog lowpass signal, wherein the digital lowpass signal is a digital baseband signal and wherein the step of modulating the digital baseband signal is performed prior to the step of converting the digital lowpass signal.

5. The method claim of claim 4 wherein the digital baseband signal prior to the step of modulating the digital baseband signal is between $-f_s/4$ and $f_s/4$ and wherein the digital baseband signal after the step of modulating the digital baseband signal is between $-f_s/2$ and $f_s/2$.

6. The method claim of claim 4 wherein the step of modulating the digital baseband signal includes:

shifting the digital baseband signal between $-f_s/4$ and $f_s/4$ to between 0 and $f_s/2$; and producing a mirror image of the shifted digital baseband signal, the mirror image being between $-f_s/2$ and 0.

7. Method of converting a digital lowpass signal to an analog signal in a frequency spectrum higher than the lowpass signal, the method comprising the steps of:

compensating for distortion;

converting the digital lowpass signal using a sampling frequency ($f_s$) to the analog signal, the analog signal having an analog lowpass signal and replicas, the replicas being at intervals of the sampling frequency;

selecting at least one of the replicas in the frequency spectrum higher than the lowpass signal; and rejecting the analog lowpass signal, wherein the step of compensating for distortion is performed prior to the step of converting the digital lowpass signal.

8. The method of claim 7 wherein the step of compensating for distortion includes determining the distortion at the frequency spectrum higher than the lowpass frequency and modifying the lowpass signal to compensate for distortion at the frequency spectrum higher than the lowpass frequency.

9. The method of claim 8 wherein the step of converting the digital lowpass signal using a sampling frequency to the analog signal includes using a digital to analog converter, wherein the digital to analog converter produces a distortion of a sin(x)/x response, and wherein the step of modifying the lowpass signal includes convolving the lowpass signal with an impulse response of the shifted x/sin(x) response.

10. Method of converting a digital baseband signal to an analog signal in a passband frequency, the passband frequency having a higher frequency than baseband, the method comprising the steps of:

modulating the digital baseband signal to produce a modulated digital baseband signal;

converting the modulated baseband signal using a sampling frequency ($f_s$) to the analog signal, the analog signal having an analog baseband signal and replicas, the replicas being at intervals of the sampling frequency; and filtering out the analog baseband signal and the replicas except for at least one replica in the passband frequency.

11. The method of claim 10 wherein the modulated digital baseband signal includes a shifted digital baseband signal and a mirror image of the shifted digital baseband signal.

12. The method of claim 11 wherein the digital baseband signal is between $-f_s/4$ and $f_s/4$; and wherein the step of modulating the digital baseband signal includes shifting the digital baseband signal from between $-f_s/4$ and $f_s4$ to between 0 and $f_s/2$ and producing a mirror image of the shifted digital baseband signal, the mirror image being between $-f_s/2$ and 0.

13. The method of claim 10 wherein the step of converting the digital baseband signal using a sampling frequency to the analog signal includes using a digital to analog converter.

14. The method of claim 10 wherein the step of filtering out the analog baseband signal and the replicas except for at least one replica in the passband frequency includes using a passband postfilter.

15. The method of claim 14 wherein the passband postfilter passes signals in a negative passband and a positive passband.

16. The method of claim 10 further comprising the step of compensating for distortion prior to the step of converting the shifted digital baseband signal.

17. The method of claim 16 wherein the step of compensating for distortion includes determining the distortion at the passband frequency and modifying the modulated baseband signal to compensate for distortion at the frequency spectrum higher than the lowpass frequency.

18. The method of claim 17 wherein the step of converting the digital baseband signal using a sampling frequency to the analog signal includes using a digital to analog converter, wherein the digital to analog converter produces a distortion of a sin(x)/x response, and wherein the step of modifying the lowpass signal includes convolving the lowpass signal with an impulse response of a shifted sin(x)/x response.

19. Apparatus for translating a lowpass signal to higher frequencies, the apparatus comprising in combination:

digital to analog converter having a sampling frequency of $f_s$ and having an input and an output, the input receiving a digital lowpass signal and the output having an analog lowpass signal and replicas at intervals of the sampling frequency, wherein the digital to analog converter generates distortion;

postfilter having an input and an output, the input of the postfilter being received from the output of the digital to analog converter, the postfilter attenuating the analog baseband signal;

precompensator for compensating the digital lowpass signal based upon the distortion which is generated by the digital to analog converter, the input for the digital to analog converter being based on the output of the precompensator.

20. The apparatus of claim 19 wherein the postfilter includes a passband postfilter being centered at a frequency higher than the lowpass signal, wherein the digital to analog converter generates distortion in the passband, and wherein the precompensator compensates the digital lowpass signal based upon the distortion in the passband.

21. The apparatus of claim 20 wherein the passband postfilter is at an intermediate frequency, the intermediate frequency being higher than the sampling frequency of the digital to analog converter.

22. The apparatus of claim 21 wherein the passband postfilter selects at least one of the replicas and rejects the analog lowpass signal.

23. Apparatus for translating a lowpass signal to higher frequencies, the apparatus comprising in combination:

digital to analog converter having a sampling frequency of $f_s$ and having an input and an output, the input receiving a digital lowpass signal and the output having an analog lowpass signal and replicas at intervals of the sampling frequency;

postfilter having an input and an output, the input of the postfilter being received from the output of the digital to analog converter, the postfilter attenuating the analog baseband signal; and modulator having an input and an output, the input of the modulator receiving an unmodified digital lowpass signal, the modulator generating the digital lowpass signal for receipt by the digital to analog converter.

24. The apparatus of claim 23 wherein the modulator includes a multiplier, the unmodified digital lowpass signal being multiplied by the multiplier.

25. The apparatus of claim 24 wherein the multiplier multiplies the unmodified digital lowpass signal by a complex sinusoid having a frequency $f_s/4$.

26. The apparatus of claim 23 wherein the digital to analog converter generates distortion in the passband and further comprising a precompensator for compensating the unmodified digital lowpass signal based upon the distortion in the passband which is generated by the digital to analog converter.

27. The apparatus of claim 26 wherein the distortion generated by the digital to analog converter is a sin(x)/x response, and wherein the precompensator modifies the lowpass signal by convolving the lowpass signal with an impulse response of a shifted sin(x)/x response.

28. Apparatus for translating a digital baseband signal to higher frequencies, the apparatus comprising in combination:

multiplier having an input and an output, the input of the multiplier receiving the digital baseband signal, the multiplier multiplying the digital baseband signal by a complex sinusoid to generate a modified digital bandpass signal;

digital to analog converter having a sampling frequency of $f_s$ and having an input and an output, the input receiving the modified digital bandpass signal and the output having an analog baseband signal and replicas at intervals of the sampling frequency; and passband postfilter having an input, the input of the postfilter being received from the output of the digital to analog converter, the passband postfilter being centered at a frequency higher than the baseband signal.

29. The apparatus of claim 28 wherein the frequency of the complex sinusoid is $f_s/4$.

30. The apparatus of claim 29 wherein the passband postfilter is centered at at least one of the replicas.

* * * * *

UNITED STATES PATENT AND TRADEMARK OFFICE
CERTIFICATE OF CORRECTION

PATENT NO.    : 6,507,303 B1
DATED         : January 14, 2003
INVENTOR(S)   : Carl H. Alelyunas, Cotter W. Sayre and Larry Thomson It is certified that error appears in the above-identified patent and that said Letters Patent is hereby corrected as shown below:

<u>Title page,</u>
Item [73], Assignee, please add -- 3Com Corporation, Santa Clara, California --.

Signed and Sealed this

Seventeenth Day of June, 2003

JAMES E. ROGAN
*Director of the United States Patent and Trademark Office*